United States Patent [19]

Ovens et al.

[11] Patent Number: 4,792,706

[45] Date of Patent: Dec. 20, 1988

[54] ECL GATES USING DIODE-CLAMPED LOADS AND SCHOTTKY CLAMPED REFERENCE BIAS

[75] Inventors: Kevin M. Ovens; Bobby D. Strong, both of Garland, Tex.

[73] Assignee: Texas Instruments Incorporated, Dallas, Tex.

[21] Appl. No.: 942,326

[22] Filed: Dec. 16, 1986

[51] Int. Cl.$^4$ .......................................... H03K 19/086
[52] U.S. Cl. ................................... 307/455; 307/443; 307/559; 307/270
[58] Field of Search .............. 307/443, 475, 454–458, 307/557–559, 561, 565, 270, 217 A; 357/15, 67, 71, 92

[56] References Cited

U.S. PATENT DOCUMENTS

| | | | |
|---|---|---|---|
| 3,569,746 | 3/1971 | Lacour et al. | 307/455 X |
| 3,649,844 | 3/1972 | Kroos | 307/455 X |
| 4,007,385 | 2/1977 | Chapron | 357/92 X |
| 4,165,470 | 8/1979 | Fulkerson | 307/454 |
| 4,488,063 | 12/1984 | Lee | 307/455 X |
| 4,518,876 | 5/1985 | Constantinescu | 307/455 X |
| 4,529,894 | 7/1985 | Chan et al. | 307/455 X |
| 4,575,647 | 3/1986 | Ashton et al. | 307/443 |
| 4,654,824 | 3/1987 | Thomas et al. | 307/317 A X |

OTHER PUBLICATIONS

Underwood, "Cascode Current Switch ALU", *IBM T.D.B.*, vol. 21, No. 12, May 1979, pp. 4808–4810.

*Primary Examiner*—Stanley D. Miller
*Assistant Examiner*—D. R. Hudspeth
*Attorney, Agent, or Firm*—George L. Craig; Leo N. Heiting; Melvin Sharp

[57] ABSTRACT

The disclosure relates to a logic circuit wherein the voltage regulators of the ECL circuits, which use resistor ratios, the values of which are difficult to control in the formation of semiconductor circuits, are replaced by a series of diodes, the areas of which are very easy to control in semiconductor fabrication, to set the threshold voltages for the transistors. Diode voltage ratios are very controllable since the diodes change only about 18 millivolts for every factor of two in current change. Thresholds can therefore easily be set in five and ten millivolt increments, this being the procedure utilized herein. Embodiments are disclosed using the basic circuit in a stacked configuration to provide AND-/NAND operation in addition to the OR/NOR operation of the basic embodiment.

20 Claims, 1 Drawing Sheet

ECL GATES USING DIODE-CLAMPED LOADS AND SCHOTTKY CLAMPED REFERENCE BIAS

BACKGROUND OF THE INVENTION

1. Field of the Invention

This invention relates to logic circuits and, more specifically, to schottky logic circuit utilizing current mode logic.

2. Brief Description of the Prior Art

Prior art logic circuits are based upon certain trade-offs, depending upon the desired features. For example, ECL (emitter coupled logic) circuits are high speed. However, they suffer the disadvantage of requiring great parameter precision and stability for current sources which precision and stability is provided in the form voltage references, thereby necessitating a relatively large number of components. This problem is compounded due to the requirement that the voltage source change in a very specific manner due to temperature change. Such ECL circuits also have a relatively high power requirement in that they normally require a supply in excess of about four volts. On the other hand, STL (schottky transistor logic) type circuits have a small voltage swing due to different schottky diode voltages, however such circuits require very low RCS transistors and are therefore restricted to low power applications, hence are limited in operating speed.

It is clearly desirable to provide the speed of ECL circuits while utilizing fewer components and less power as well as providing such circuit with small voltage swing, but which has higher power capability and higher speed than the STL type circuits.

SUMMARY OF THE INVENTION

In accordance with the present invention, there is provided a new form of ECL circuit which provides the above noted desirable properties in a single simple circuit and which has the advantages of higher power capability per gate than STL. Therefore greater speed is provided by using two different types of schottky diodes to set voltage swings and thresholds and results in the use of fewer components than ECL circuits. There is no need for current sources, the voltage reference in the basic circuit requiring only two components, a schottky diode and a resistor.

Briefly, in accordance with the present invention, the voltage regulators of the ECL circuits, which use resistor ratios, the values of which are difficult to control in the formation of semiconductor circuits, are replaced by a series of different types of schottky diodes, the areas of which are very easy to control in semiconductor fabrication, to set the threshold voltages for the transistors. Diode voltage ratios are very controllable since the diodes change only about 18 millivolts for every factor of two in current change. Thresholds can therefore easily be set in five and ten millivolt increments, this being the procedure utilized herein.

In accordance with a first embodiment of the invention, the reference voltages are set utilizing a titanium tungsten (TiW) type of schottky diode having a forward voltage drop of about 300 millivolts as the reference diode in conjunction with a resistor and threshold voltages are set further using platinum silicide type schottky diodes having a forward voltage drop of about 600 millivolts wherein the reference voltage is set by the amount of current passing through the reference schottky diode, this voltage being determined by the value of the resistor in the voltage divider circuit across the power or voltage source. The resistor value is not critical since a large change in value of the resistor will result in only a small change in voltage across the reference schottky diode, thereby maintaining a substantially constant and stable reference voltage from circuit to circuit. The voltage reference source is also low impedance since the reference diode is being used in its forward direction. In addition, the resistor R3 of FIG. 1 replaces a current source required in ECL circuits of the prior art to drive the gates of the transistors. The ratio of the current density in schottky platinum silicide diodes D1 and D2 to the current density in the reference schottky diode DR can be adjusted during device fabrication to adjust threshold levels.

In accordance with a second embodiment of the invention, the circuit of the first embodiment is altered to accommodate switching from a high logic level to a low logic level to adjust for circuit stacking. This is accomplished by adding an additional diode voltage drop across diode DR1 in the power source and adding an additional transistor to the base circuit of QN wherein the base thereof is coupled to Vcc through a resistor and the emitter is coupled to ground through a resistor.

In accordance with a third embodiment of the invention, an AND/NAND circuit is shown using the basic circuit of the first embodiment wherein an additional transistor level is stacked beneath the transistor pair of the first embodiment. An appropriate diode DR1 is placed in the power source to provide an additional diode level voltage drop for each level of transistors.

In accordance with a fourth embodiment of the invention, a voltage divider is placed across the diode DR of the embodiment of FIG. 1 with the base drive for transistor QR being taken from the voltage divider. In this manner, since the voltage across the diode DR is fixed, the base drive voltage for transistor QR is fixed to turn said transistor fully off to avoid a possibly partial on condition thereof.

DESCRIPTION OF THE PREFERRED EMBODIMENTS

Figure 1:
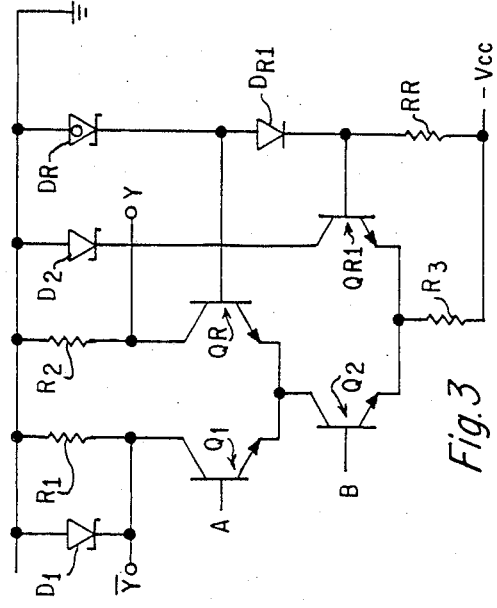
FIG. 1 is a circuit diagram of a logic circuit in accordance with a first embodiment of the present invention.

Referring now to FIG. 1, there is shown a circuit diagram of a first embodiment of the present invention in the form of an OR/NOR logic circuit. The circuit includes a voltage divider circuit composed of titanium tungsten schottky diode DR, having a forward voltage drop of about 300 millivolts, and resistor RR, connected in series across a negative voltage source —Vcc and reference potential (ground). The junction of the diode DR and resistor RR is connected to the base of a reference NPN transistor QR, the emitter of which is connected through resistor R3 to the voltage source —Vcc. A resistor R2 and platinum silicide schottky diode D2, are connected in parallel between ground and the collector of transistor QR. A plurality of NPN transistors Q1 to QN are connected in parallel, with the emitter of each being connected to the voltage source −Vcc through resistor R3 and the collector of each being connected to ground through the parallel connected circuit composed of schottky platinum silicide diode D1 and resistor R1. Diodes D1 and D2 have a forward voltage drop of about 600 millivolts. By using the same types of diodes and adjusting the current densities thereof, the voltage swings can be made much smaller. This provides about a 600 millivolt voltage swing on the bases of transistors Q1 to QN which is slow, but provides a great deal of noise immunity. The bases of transistors Q1 to QN are noted as A ... N. The NOR output is taken from the collector of transistor QN and the OR output is taken from the collector of transistor QR.

The threshold of the inputs A to N is set by the voltage drop of diode DR and transistor QR. The output voltage swing of the gate is set by either the current density of diodes D1 and D2 relative to diode DR as stated above or the ratios of resistors R1:R3 or R2:R3 and Vcc if the voltage drop of diode DR is less than the voltage swing of the outputs and the gate then performs the OR/NOR functions. Diodes D1 and D2 are designed to have a much larger voltage drop thereacross than is provided across diode DR by a factor of about 2:1.

Therefore, if one of the transistors QA to QN (assume N) is turned on by having its input go high (to about zero volts), both diode D1 and resistor R1 will conduct (it being assumed that the value of resistor R1 is high enough to force some current through diode D1) with the voltage across resistor R1 being clamped to the voltage drop across diode D1. This makes the ratio of the value of resistors R1 to R3 non-critical which is not the case in ECL logic. Therefore all current through resistor R3 is coming through transistor QN with transistor QR being off due to the base-emitter voltage drop thereacross of about 0.5 volts. This pulls up the voltage on the collector of transistor QR to about zero volts to provide a logic high level on the OR output and also provides a logic low level (about −0.6 volts) on the collector of transistor QN or NOR output.

Now, assuming the inputs A through N are low, the bases of transistors Q1 through QN are low and the collectors thereof will be non-conducting. Since ECL swings around a reference voltage, the reference voltage being set up by diode DR, the reference level will be about −0.3 volts at the cathode of diode DR, the low level on the input will be about −0.6 volts and the high level on the input will be about zero volts. With the inputs at −0.6 volts, the voltage across resistor R3 will go as high as it can and transistor QR will conduct to pull resistor R3 up. Since transistor QR can conduct more current through resistor R3 than transistors Q1 through QN, transistors Q1 through QN will be off. Therefore the collectors of transistors Q1 through QN are non-conducting and provide a high signal on the NOR output with resistor R1 pulling the NOR output up to zero volts (ground). The OR output is connected to the collector of transistor QR which is in the on state. This on state is clamped by diode D2 which forces the NOR output to the low level of −0.6 volts. This is independent of any resistor ratios. The major concern in this circuit is the voltage difference across diodes D1 and D2, the difference being required to set the threshold of transistor QR and therefore the transistors Q1 to QN. It is also necessary that resistor R3 be at a sufficiently low value so that it will draw sufficient current to forward bias diode D2, this requiring that resistor R2 draw sufficient current to forward bias diode D2.

The above described circuit of FIG. 1 also has been found to operate satisfactorily with removal of resistors R1 and R2 with the voltage swing decreasing from the 600 millivolt range to about the 100 millivolt range. This provides an increase in speed of operation. The key feature in each of these embodiments is that the thresholds are all set by diodes rather than by resistor ratios and emitter ratios and band gap regulators as in the prior art. This provides extremely good control of the threshold voltages.

Figure 2:
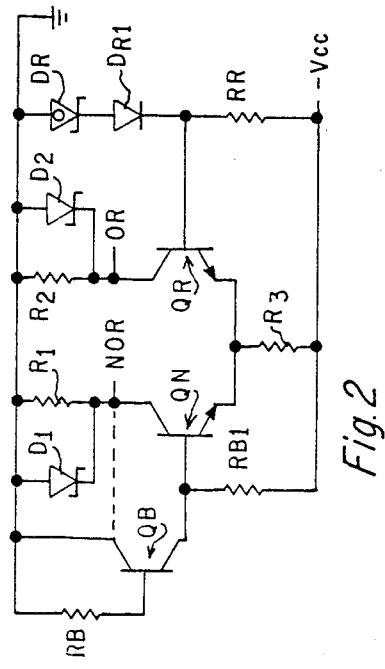
FIG. 2 is a circuit diagram of a logic circuit in accordance with a second embodiment of the present invention.

Referring now to FIG. 2, there is shown the use of a buffer in switching from a high logic level to a low logic level. Logic levels can be shifted for stacking and buffered output drivers. The circuit is the same as that of FIG. 1 except for the addition of the extra diode DR1, the resistors RB and RB1 and transistor QB and the fact that the voltage level on the base of Q1 (not shown) to QN and QR is shifted down by 0.8 volts due to diode DR1. Diode DR1 is therefore added to transfer from a high level reference or one diode voltage drop to a low level reference or two diode voltage drop. Resistor RB and the base of transistor QB can connect to a previous gate NOR or OR output. Resistor RB, transistor QB and resistor RB1 form form a high current buffer. Resistor RB, which could be the output resistor of the prior stage (resistors R1, or R2 in FIG. 1), therefore is not needed. Since the voltage on the emitter of transistor QB is one Vbe lower than the normal output swing, the threshold of the gate of transistor QR must be lowered by one Vbe. Diode DR1 performs this function. The gate of FIG. 2 therefore translates logic levels from the buffered level to the normal level.

Figure 3:
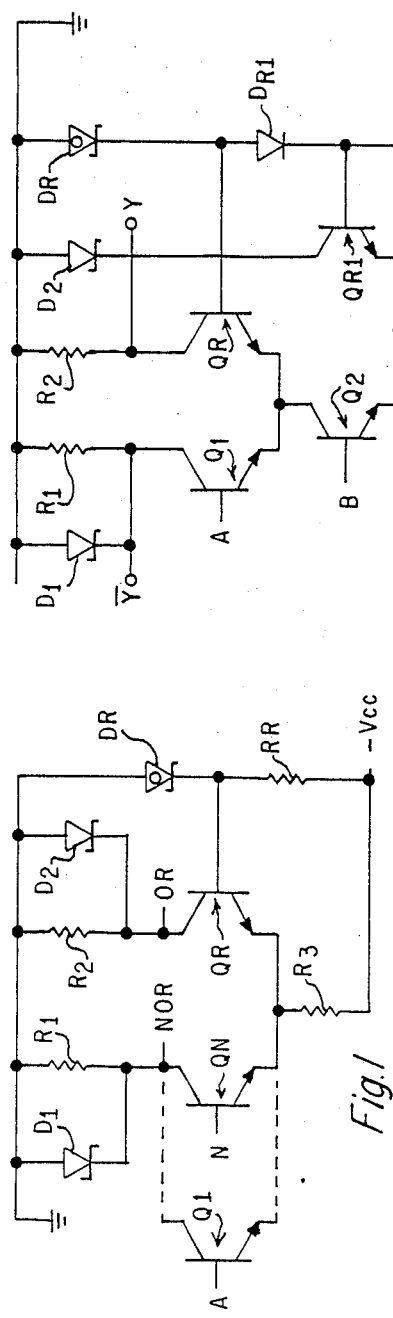
FIG. 3 is a circuit diagram of a logic circuit in accordance with a third embodiment of the present invention.

Referring now to FIG. 3, there is shown an AND/NAND type circuit using the principles as set forth hereinabove. The circuit includes transistors Q1 and QR with diodes D1 and D2 and resistors R1 and R2 which are the same as in the embodiment of FIG. 1. Also shown are diode DR and resistor RR which perform the same function as in the embodiment of FIG. 1. The added circuitry required to perform the AND function is transistor Q2 which is coupled between the emitters of transistor Q1 and QR and supply −Vcc through resistor R3, transistor QR1 which is coupled between the cathode of diode D2 and resistor R3 and platinum silicide diode DR1 which is in series with diode DR and resistor RR and provides the threshold to transistor QR1. In order to prevent saturation of the gates when one gate is on and the other gate is off, B level, composed of transistors Q2 and QR1 has a threshold which is typically one Vbe lower than transistors Q and QR, this being obtained by the addition of diode DR1. The outputs taken at Y and Y bar provide AND/NAND functions respectively. Further sets of such diodes and transistors can be stacked in the manner shown in FIG. 3 to provide additional logic levels. The amount of stacking is limited by the value of Vcc and the transistor breakdown voltages.

In operation, if both inputs A and B of FIG. 3 are high, input A will be at zero volts and input B will be at −0.8 volts. This will cause transistors Q1 and Q2 to conduct and force the Y bar output low. The base of transistor QR will be at −0.3 volts and that transistor will be off because its base-emitter junction is not forward biased. Therefore, transistor Q1 conducts. Since input B is at −0.8 volts and the base of transistor QR1 is at −1.1 volts, transistor QR1 will not have sufficient base-emitter voltage to conduct. Therefore, transistors Q1 and Q2 are conducting and the collectors thereof will have current running therethrough. If the current is sufficiently large to forward bias the resistor R1 on the collector of transistor Q1, the diode D1 on that collector will forward bias and clamp Y bar to a voltage of about −0.6 volts.

If input A is low (−0.6 volts) and input B is high (−0.8 volts), transistor Q1 will be off and transistor QR will conduct through transistor Q2. The collector of transistor QR will then be clamped to −0.6 volts.

If the B input is low (−1.4 volts), transistor Q2 will be off. Therefore, regardless of the condition of input A, no current can flow through transistor Q2. Accordingly, current must flow through transistor QR1, clamping the collector of transistor QR to −0.6 volts by the diode D2 tied to its collector. Therefore, the output of the AND gate, which is the Y output, will be low.

Figure 4:
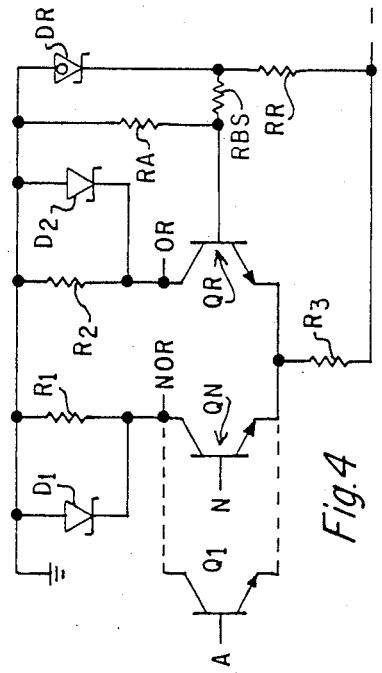
FIG. 4 is a circuit diagram of a fourth embodiment in accordance with the present invention.

In accordance with a fourth embodiment of the invention as shown in FIG. 4, a problem which exists in the case wherein all of the diodes D1, D2 and DR of, for example, FIG. 1 are of the same material is overcome. The problem is that, with such circuitry of FIG. 1 with the above noted diodes being the same, there was often difficultly in that when transistor Q1 was to be turned on and transistor QR was to be turned off, transistor Q1 would not turn full on and transistor QR would not turn full off. To solve this problem, a voltage divider circuit composed of series resistors RA and RB has been placed across diode DR with transistor QR receiving its base voltage from the voltage divider node joining resistors RA and RB. Since the voltage across diode DR is fixed and since the ratio of resistors RA to RB can be fixed, the drive current to the base of transistor QR can be adjusted to determine how hard transistor QR will turn off.

It can be seen that there has been provided a simple circuit which has relatively few components compared to ECL circuits of the prior art and operates with a simple biasing network composed of a schottky diode and a resistor and yet has substantially equivalent speed to prior art STL circuits.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A logic circuit which comprises:
   (a) first and second semiconductor devices having collector electrodes, control electrodes and emitter electrodes, said emitter electrodes connected to a common node,
   (b) a source of voltage coupled to said emitter electrodes,
   (c) a reference voltage source coupled to said collector electrodes, and
   (d) threshold voltage setting means coupled across said source of voltage and said reference voltage source including a first, Schottky diode and a first resistor in series therewith, the junction of said first Schottky diode and said first resistor being coupled to said control electrode of said first semiconductor device to provide a threshold voltage equal to the forward bias voltage of the first Schottky diode,
   (e) logic signal input means connected to the control electrode of said second semiconductor device,
   (f) first output means connected to one of the collector electrodes of one of said semiconductor devices;
   (g) first means for setting high and low output levels of said first output means, said first level setting means including a parallel connected combination of a second diode and a second resistor coupled between said reference voltage source and the collector connected to said first output means, to provide a difference in high and low output levels equal to the forward bias of the second diode.

2. A logic circuit as set forth in claim 1, further comprising:
   (h) second output means connected to the collector electrode of said other semiconductor device for providing an output complementary to said first output, and
   (i) second means for setting high and low output levels of said second output means, said second level setting means including a parallel connected combination of a third diode and a third resistor coupled between said reference voltage source and the collector connected to said second output means to provide a difference in high and low ouput levels equal to the forward bias of the third diode.

3. A logic circuit as set forth in claim 2, further including a fourth resistor coupled between said commonly connected emitter electrodes and said source of voltage.

4. A logic circuit as set forth in claim 1, wherein the forward bias of said second diode is greater than the forward bias voltage of said first diode.

5. A logic circuit as set forth in claim 4, wherein the forward bias voltage of the second diode is about double the forward bias voltage of the first diode.

6. A logic circuit as set forth in claim 2, wherein the forward bias voltage of the third diode is greater than the forward bias voltage of the first diode.

7. A logic circuit as set forth in claim 6, wherein the forward bias voltage of the third diode is about double the forward bias voltage of the first diode.

8. A logic circuit as set forth in claim 1, wherein one or more further semiconductor devices each having a collector, control and emitter electrodes each of said further semiconductor devices having its collector connected to the collector of the second semiconductor device, its emitter connected to the emitter of the second semiconductor device and its control electrode connected to a respective further logic signal input means.

9. A logic circuit as set forth in claim 1, wherein said first diode is formed of titanium tungsten.

10. A logic circuit as set forth in claim 1, wherein said second diode is a Schottky diode formed of platinum silicide.

11. A logic circuit as set forth in claim 2, wherein said third diode is a Schottky diode formed of platinum silicide.

12. A logic cirucit as set forth in claim 1, wherein said semiconductor devices are NPN transistors and said source of voltage is a negative voltage source relative to said reference voltage source.

13. A logic circuit as set forth in claim 2, wherein said semiconductor devices are NPN transistors and said source of voltage is a negative voltage source relative to said reference voltage source.

14. A logic circuit as set forth in claim 8, wherein said semiconductor devices are NPN transistors and said source of voltage is a negative voltage source relative to said reference voltage source.

15. A logic circuit as set forth in claim 1, further including a further diode coupled between said first Schottky diode and said first resistor, the junction of said first resistor and said further diode being coupled to the control electrode of said first semiconductor device, a third semiconductor device having an emitter electrode coupled to said control electrode of said second semiconductor device, a resistor coupled between said voltage source and said control electrode of said second semiconductor device, a resistor coupled between the control electrode of said third semiconductor device and said reference voltage source, said collector electrode of said third semiconductor device being coupled to said reference voltage source.

16. A logic circuit as set forth in claim 1 further including third and fourth semiconductor devices, each having emitter, collector and control electrodes, said emitter electrodes of said third and fourth semiconductor devices being commonly connected, a fourth resistor coupled between said commonly connected electrodes of said third and fourth semiconductor devices and said source of voltage, the collector electrode of said first semiconductor device being coupled to the collector electrode of said third semiconductor device, a further diode coupled between said first Schottky diode and said first resistor, the junction of said first Schottky diode and said further diode being coupled to the control electrode of said first semiconductor device, the junction of said further diode and said first resistor being coupled to the control electrode of said third semiconductor device, the collector electrode of said fourth semiconductor device coupled to the commonly connected emitter electrodes of said first and second semiconductor devices and second logic signal input means coupled to the control electrode of said fourth semiconductor device.

17. A logic circuit which comprises:
(a) a first and second semiconductor devices having collector electrodes, control electrodes and emitter electrodes, said emitter electrodes connected to a common node,
(b) a source of voltage coupled to said emitter electrodes,
(c) a reference voltage source coupled to said collector electrodes, and
(d) threshold voltage setting means coupled across said source of voltage and said reference voltage source including a first Schottky diode and a first resistor in series therewith, and a voltage divider circuit coupled across said Schottky diode, said voltage divider circuit being coupled to said control electrode of said first semiconductor device, logic signal input means coupled to the control electrode of said second semiconductor device.

18. A logic circuit as set forth in claim 17, further including a parallel connected combination of a second diode and a second resistor coupled between said reference voltage source and one of said collector electrodes, said second diode setting the maximum voltage across said second resistor.

19. A logic circuit as set forth in claim 17 or 18, further including a third resistor coupled between said common node of said emitter electrodes and said source of voltage.

20. A logic circuit as set forth in claim 18, further including a parallel connected combination of a third diode and a fourth resistor coupled between said reference voltage source and the other said collector electrodes, said third diode setting the maximum voltage across said fourth resistor.

* * * * *